United States Patent
Chen

(10) Patent No.: US 11,503,242 B2
(45) Date of Patent: Nov. 15, 2022

(54) READOUT INTEGRATED CIRCUIT

(71) Applicant: Novatek Microelectronics Corp., Hsinchu (TW)

(72) Inventor: Chi-Ting Chen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 34 days.

(21) Appl. No.: 17/168,201

(22) Filed: Feb. 5, 2021

(65) Prior Publication Data
US 2021/0250537 A1 Aug. 12, 2021

Related U.S. Application Data

(60) Provisional application No. 62/970,713, filed on Feb. 6, 2020.

(51) Int. Cl.
| | |
|---|---|
| *G06V 40/13* | (2022.01) |
| *H04N 5/378* | (2011.01) |
| *H01L 27/146* | (2006.01) |
| *H01L 23/00* | (2006.01) |
| *H01L 25/16* | (2006.01) |
| *H01L 27/32* | (2006.01) |

(52) U.S. Cl.
CPC ......... *H04N 5/378* (2013.01); *G06V 40/1318* (2022.01); *H01L 23/00* (2013.01); *H01L 27/14678* (2013.01); *H01L 25/167* (2013.01); *H01L 27/32* (2013.01)

(58) Field of Classification Search
CPC ...................................................... G06F 3/042
See application file for complete search history.

(56) References Cited

U.S. PATENT DOCUMENTS

| | | | |
|---|---|---|---|
| 9,298,316 B2 | 3/2016 | Chen et al. | |
| 2014/0027606 A1 | 1/2014 | Raynor et al. | |
| 2014/0125632 A1 | 5/2014 | Chen et al. | |
| 2020/0195870 A1* | 6/2020 | Shim | H04N 5/3559 |

FOREIGN PATENT DOCUMENTS

TW     201419090     5/2014

OTHER PUBLICATIONS

"Notice of Allowance of Taiwan Counterpart Application," dated Dec. 22, 2021, p. 1-p. 5.

* cited by examiner

*Primary Examiner* — Joseph R Haley
(74) *Attorney, Agent, or Firm* — JCIPRNET

(57) ABSTRACT

A readout integrated circuit configured to read out sensing signals from an optical sensing panel including a sensor array for fingerprint sensing is provided. The readout integrated circuit includes a plurality of input terminals, a comparator circuit and a control circuit. The plurality of input terminals are configured to be coupled to a plurality of output terminals of the optical sensing panel. The comparator circuit is configured to receive an output voltage from an output terminal of the plurality of output terminals of the optical sensing panel and at least one reference voltage, compare the output voltage to the at least one reference voltage and output a comparison result. The control circuit is coupled to the comparator circuit. The control circuit is configured to receive the comparison result and determine a supplementary charge amount to be charged to or discharged from the output terminal according to the comparison result.

19 Claims, 11 Drawing Sheets

READOUT INTEGRATED CIRCUIT

CROSS-REFERENCE TO RELATED APPLICATION

This application claims the priority benefit of U.S. Provisional application Ser. No. 62/970,713, filed on Feb. 6, 2020. The entirety of the above-mentioned patent application is hereby incorporated by reference herein and made a part of this specification.

BACKGROUND

Technical Field

The invention relates to an electronic circuit, more specifically, to a readout integrated circuit.

Description of Related Art

An in-display fingerprint sensing panel equipped with optical sensors is fabricated on a lower substrate of a display panel. The optical sensors arranged as a sensor array are utilized for sensing lights reflected from a finger positioned on the fingerprint sensing panel to generate fingerprint sensing signals, and the fingerprint sensing signals are received by a fingerprint readout integrated circuit through sensing lines and output terminals of the fingerprint sensing panel. The fingerprint readout integrated circuit is configured to read out the fingerprint sensing signals and further transmit the fingerprint sensing signals that are converted to digital sensing data to a processing unit for fingerprint recognition. For example, regarding to a handheld device such as a mobile phone having a touch display screen with an in-display fingerprint sensing panel, the fingerprint readout integrated circuit in the mobile phone may transmit fingerprint sensing data to an application processor. The application processor then performs image processes on the fingerprint sensing data to generate a fingerprint image for fingerprint recognition.

However, when the size of the fingerprint sensing panel is large, transmission distances from optical sensors (called the fingerprint sensing pixels) at different positions to the output terminals of the fingerprint sensing panel may be different. Some of the optical sensors are located close to corresponding output terminals and transmit the fingerprint sensing signals through a shorter distance, whereas the other optical sensors are located far from corresponding output terminals and transmit the fingerprint sensing signals through a long distance. For the optical sensors which are far from the output terminals, the fingerprint sensing signals are transmitted through the sensing line which has a large load. It may lead to a negative impact for the fingerprint sensing signals. For example, a settling time of the fingerprint sensing signals may be too long, such that the quality of the fingerprint image generated according to the fingerprint sensing signals becomes poor.

SUMMARY

The invention is directed to a readout integrated circuit, in which the settling time of the fingerprint sensing signals is short to improve the quality of the fingerprint image.

An embodiment of the invention provides a readout integrated circuit configured to read out sensing signals from an optical sensing panel including a sensor array for fingerprint sensing. The readout integrated circuit includes a plurality of input terminals, a comparator circuit and a control circuit. The plurality of input terminals are configured to be coupled to a plurality of output terminals of the optical sensing panel. The comparator circuit is coupled to an input terminal of a plurality of input terminals. The comparator circuit is configured to receive an output voltage from an output terminal of the plurality of output terminals of the optical sensing panel and at least one reference voltage, compare the output voltage to the at least one reference voltage and output a comparison result. The control circuit is coupled to the comparator circuit. The control circuit is configured to receive the comparison result and determine a supplementary charge amount to be charged to or discharged from the output terminal according to the comparison result.

In an embodiment of the invention, the comparator circuit compares the output voltage to the at least one reference voltage at different time points to generate at least one comparison result. According to the respective comparison result, the control circuit determines the supplementary charge amount to be charged to or discharged from the output terminal.

In an embodiment of the invention, the at least one reference voltage includes a first reference voltage. When the comparison result indicates the output voltage is in a range from the first reference voltage to a maximum reference voltage, the control circuit determines a first charge amount as the supplementary charge amount to be charged to the output terminal according to the comparison result. When the comparison result indicates the output voltage is smaller than the first reference voltage, the control circuit determines a charge amount smaller than the first charge amount as the supplementary charge amount to be charged to the output terminal according to the comparison result.

In an embodiment of the invention, the at least one reference voltage further includes a second reference voltage smaller than the first reference voltage. When the comparison result indicates the output voltage is in a range from the second reference voltage to the first reference voltage, the control circuit determines a second charge amount as the supplementary charge amount to be charged to the output terminal according to the comparison result. When the comparison result indicates the output voltage is smaller than the second reference voltage, the control circuit determines a charge amount smaller than the second charge amount as the supplementary charge amount to be charged to the output terminal according to the comparison result.

In an embodiment of the invention, the at least one reference voltage further includes a third reference voltage smaller than the second reference voltage. When the comparison result indicates the output voltage is in a range from the third reference voltage to the second reference voltage, the control circuit determines a third charge amount as the supplementary charge amount to be charged to the output terminal according to the comparison result. When the comparison result indicates the output voltage is smaller than the third reference voltage, the control circuit determines a charge amount smaller than the third charge amount as the supplementary charge amount to be charged to the output terminal according to the comparison result.

In an embodiment of the invention, the at least one reference voltage includes a first reference voltage. When the comparison result indicates the output voltage is in a range from the first reference voltage to a minimum reference voltage, the control circuit determines a first charge amount as the supplementary charge amount to be discharged from the output terminal according to the comparison result. When the comparison result indicates the output voltage is larger than the first reference voltage, the control circuit determines a charge amount smaller than the first charge amount as the supplementary charge amount to be discharged from the output terminal according to the comparison result.

In an embodiment of the invention, the at least one reference voltage further includes a second reference voltage larger than the first reference voltage. When the comparison result indicates the output voltage is in a range from the second reference voltage to the first reference voltage, the control circuit determines a second charge amount as the supplementary charge amount to be discharged from the output terminal according to the comparison result. When the comparison result indicates the output voltage is larger than the second reference voltage, the control circuit determines a charge amount smaller than the second charge amount as the supplementary charge amount to be discharged from the output terminal according to the comparison result.

In an embodiment of the invention, the at least one reference voltage further includes a third reference voltage larger than the second reference voltage. When the comparison result indicates the output voltage is in a range from the third reference voltage to the second reference voltage, the control circuit determines a third charge amount as the supplementary charge amount to be discharged from the output terminal according to the comparison result. When the comparison result indicates the output voltage is larger than the third reference voltage, the control circuit determines a charge amount smaller than the third charge amount as the supplementary charge amount to be discharged from the output terminal according to the comparison result.

In an embodiment of the invention, the readout integrated circuit further includes a first charging/discharging circuit. The first charging/discharging circuit is coupled to the output terminal. The first charging/discharging circuit is configured to be controlled by the control circuit to charge or discharge the output terminal by a first current. The first charging/discharging circuit includes a first current source controlled by a first voltage to generate the first current.

In an embodiment of the invention, the first charging/discharging circuit further includes a switch element. The switch element is coupled to a control terminal of the first current source such that a turn-on period of the switch element determines a period of the first current source outputting the first current. The supplementary charge amount is determined based on the first current and the period of the first current source outputting the first current.

In an embodiment of the invention, the switch element is coupled to the control circuit and is turned on or off by a control signal from the control circuit. The control signal is generated by the control circuit according to the determined supplementary charge amount.

In an embodiment of the invention, the first charging/discharging circuit further includes a conversion circuit. The conversion circuit is coupled to a control terminal of the first current source and the control circuit. The conversion circuit is configured to generate a control voltage to be outputted to the control terminal of the first current source according to a control signal from the control circuit. The amount of the first current is determined according to the control voltage.

In an embodiment of the invention, a period of the first current source outputting the first current is determined by the control signal from the control circuit.

In an embodiment of the invention, the readout integrated circuit further includes a first charging/discharging circuit. The first charging/discharging circuit is coupled to the output terminal. The first charging/discharging circuit is configured to be controlled by the control circuit to charge or discharge the output terminal. The first charging/discharging circuit includes a buffer circuit. The buffer circuit is configured to receive an input voltage from the control circuit and a timing control signal from the control circuit and output a driving voltage to charge or discharge the output terminal. A period of the buffer circuit outputting the driving voltage is controlled by the timing control signal.

In an embodiment of the invention, the readout integrated circuit further includes a second charging/discharging circuit. The second charging/discharging circuit is coupled to the output terminal. The second charging/discharging circuit is configured to charge or discharge the output terminal by a second current.

In an embodiment of the invention, the output terminal is coupled to a second charging/discharging circuit. The second charging/discharging circuit is disposed in a display panel that the sensor array is disposed. The second charging/discharging circuit is configured to charge or discharge the output terminal by a second current.

In an embodiment of the invention, the readout integrated circuit further includes a storage circuit. The storage circuit is coupled to the control circuit. The storage circuit is configured to store a look-up table. Look-up table information of different charge amounts corresponding to a plurality of preconfigured comparison result.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Embodiments are provided below to describe the disclosure in detail, though the disclosure is not limited to the provided embodiments, and the provided embodiments can be suitably combined. The term "coupling/coupled" or "connecting/connected" used in this specification (including claims) of the application may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

Figure 1:
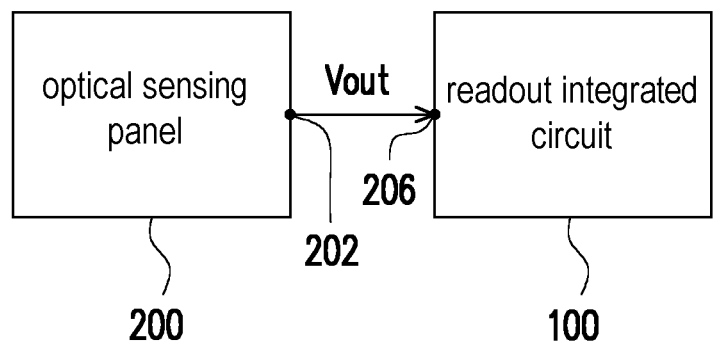
FIG. 1 is a schematic block diagram illustrating a readout integrated circuit and a sensor array for fingerprint sensing according to an embodiment of the invention.
Figure 2:
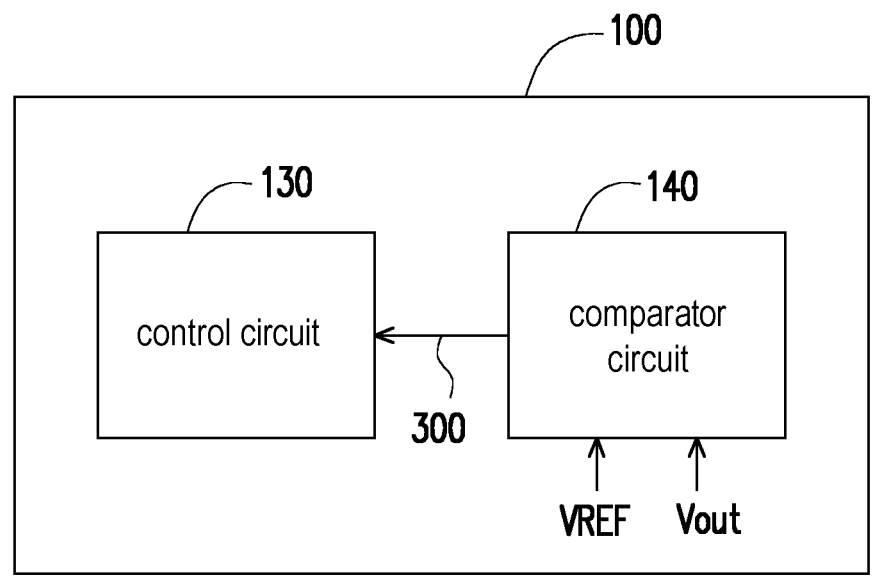
FIG. 2 is a schematic block diagram illustrating the readout integrated circuit depicted in FIG. 1 according to an embodiment of the invention.
Figure 3:
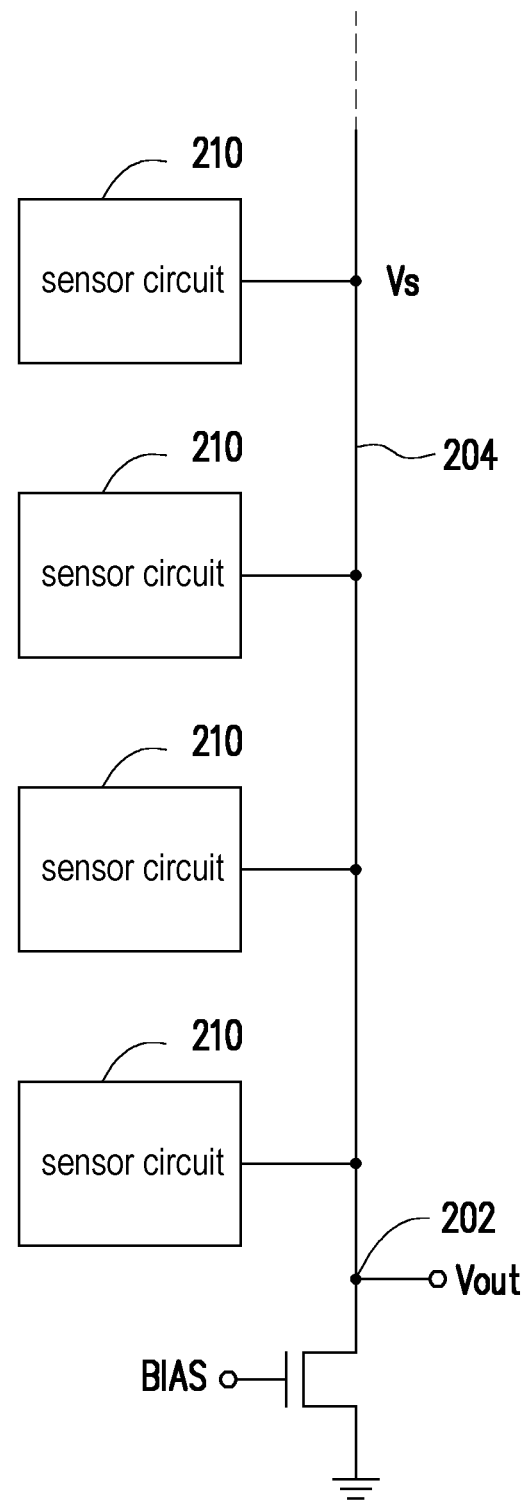
FIG. 3 is a schematic diagram illustrating a plurality of sensor circuits arranged in a column of the sensor array depicted in FIG. 1 according to an embodiment of the invention.

FIG. 1 is a schematic block diagram illustrating a readout integrated circuit and an optical sensing panel according to an embodiment of the invention. In this embodiment, the optical sensing panel is an in-display fingerprint sensing panel which is fabricated in a display panel. FIG. 2 is a schematic block diagram illustrating the readout integrated circuit depicted in FIG. 1 according to an embodiment of the invention. FIG. 3 is a schematic diagram illustrating a plurality of sensor circuits arranged in a column of a sensor array in the optical sensing panel depicted in FIG. 1 according to an embodiment of the invention.

Referring to FIG. 1 to FIG. 3, an optical sensing panel 200 includes a sensor array formed by a plurality of sensor circuits 210 serving as sensing pixels, a plurality of sensing lines 204, and a plurality of output terminals 202 which are capable of outputting fingerprint sensing signals. Each column of sensor circuits is coupled to a respective sensing line 204. The number of the output terminals 202 of the optical sensing panel 200 may be the same as or less than the number of the sensing lines 204.

A readout integrated circuit 100 includes a plurality of input terminals 206, and the plurality of input terminals 206 are configured to be coupled to some of the plurality of output terminals 202 of the optical sensing panel 200. It is noted that, for a current fingerprint sensing operation, the number of fingerprint sensing signals being processed at the same time by the readout integrated circuit 100 is determined based on circuit design of the readout integrated circuit 100, which may be related but not limited to the number of analog front-end circuits in the readout integrated circuit 100 that can parallel process the received fingerprint sensing signals. The locations and the quantity of the sensor circuits which are active for a current fingerprint sensing operation may not be all of the sensor circuits of the optical sensing panel 200. These active sensor circuits for a current fingerprint sensing operation may be a predetermined part of the sensor array or may be determined according to a touch position with respect to a touch event. In an example, the optical sensing panel 200 may have 1080 columns of sensor circuits, 1080 sensing lines and 1080 output terminals, and the readout integrated circuit 200 includes 250 input terminals, such that only 250 output terminals of the 1080 output terminals of the optical sensing panel 200 are respectively coupled to the 250 input terminals of the readout integrated circuit 100. Thus, at the same time, fingerprint sensing signals generated from 250 sensor circuits among a row can be transmitted to the readout integrated circuit 100 through the 250 output terminals.

In FIG. 3, only the sensor circuits 210 coupled to the same sensing line 204 are illustrated for example, but the invention is not limited thereto. In view point of the readout integrated circuit 100, the input terminals 206 of the readout integrated circuit 100 are coupled to a part of the sensing lines 204 via a part of the output terminals 202 of the input terminals 206. The readout integrated circuit 100 is configured to read out an output voltage Vout of the output terminal 202, which is ideally expected to be equivalent to an output voltage of a sensor circuit, called a sensing voltage Vs. However, more distance from the sensor circuit to the output terminal 202, more load resulted from the resistance and capacitance of the sensing line 204, and it costs more time to make the output voltage Vout of the output terminal 202 settle to the sensing voltage Vs. It should be noted that, regarding to the output voltage Vout of the output terminals 202 during a readout period, a process from the output voltage Vout at the beginning of a readout period to the sensing voltage Vs that the sensor circuit actually outputs may be regarded as a discharging process if the output voltage Vout at the beginning of the readout period is higher than the sensing voltage Vs. Herein, the output voltage Vout of the output terminals 202 at the beginning of the readout period is determined based on a circuit design of the readout integrated circuit. In other embodiments, a process from the output voltage Vout at the beginning of the readout period to the sensing voltage Vs that the sensor circuit actually outputs may be regarded as a charging process if the output voltage Vout at the beginning of the readout period is lower than the sensing voltage Vs that the sensor circuit actually outputs.

The readout integrated circuit 100 includes a comparator circuit 140 and a control circuit 130. The comparator circuit 140 is coupled to an input terminal 206 of the input terminals 206 as illustrated in FIG. 3. That is, the comparator circuit 140 is coupled to one output terminal 202 of the output terminals 202 of the optical sensing panel 200 via the input terminal 206. The comparator circuit 140 is configured to receive the output voltage Vout from the output terminal 202 and at least one reference voltage VREF. The comparator circuit 140 compares the output voltage Vout to the at least one reference voltage VREF and outputs a comparison result 300 to the control circuit 130. The control circuit 130 is coupled to the comparator circuit 140. The control circuit 130 is configured to receive the comparison result 300 and determine a supplementary charge amount to be charged to or discharged from the output terminal 202 according to the comparison result 300, such that a voltage of the output terminal 202 can approach a corresponding target voltage (i.e. the sensing voltage Vs that the sensor circuit outputs without considering RC loading). The settling time of the fingerprint sensing signals, i.e. the output voltage, is short to improve the quality of the fingerprint image. The settling time is the time required for the output voltage Vout to reach and remain within a given band.

In an embodiment, the control circuit 130 may include a controller implemented by one or more processing elements, such as an array of logic gates, an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result.

Figure 4:
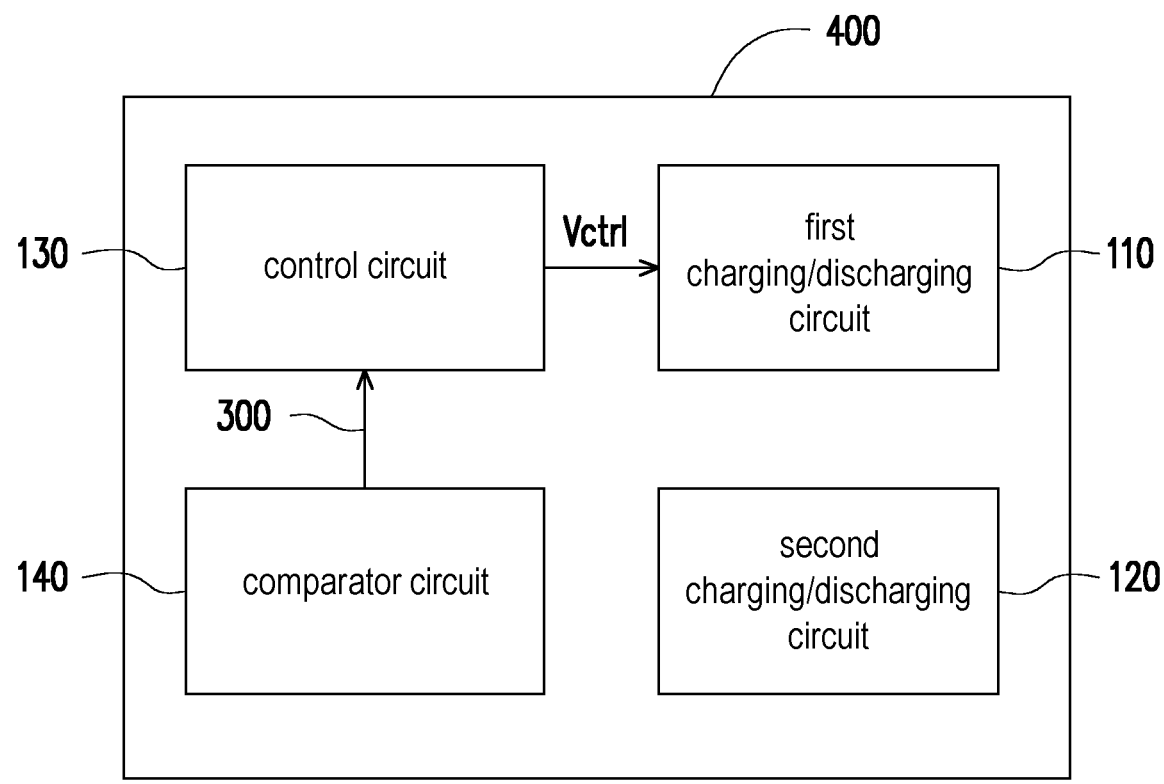
FIG. 4 is a schematic block diagram illustrating a readout integrated circuit according to another embodiment of the invention.

FIG. 4 is a schematic block diagram illustrating a readout integrated circuit according to another embodiment of the invention. Referring to FIG. 2 and FIG. 4, the readout integrated circuit 400 of the present embodiment is similar to the readout integrated circuit 100 of FIG. 2, and the main difference therebetween, for example, lies in that the readout integrated circuit 400 further includes a first charging/discharging circuit 110 and a second charging/discharging circuit 120. In an embodiment, the second charging/discharging circuit 120 is disposed in the readout integrated circuit 400, and the readout integrated circuit 400 is implemented in a single semiconductor chip or circuitry, but the invention is not limited thereto. In another embodiment, the second charging/discharging circuit 120 can be implemented in a device different from the readout integrated circuit 400. For example, the second charging/discharging circuit 120 may be disposed in a display panel (not shown) that the sensor array 200 is disposed.

Figure 5:
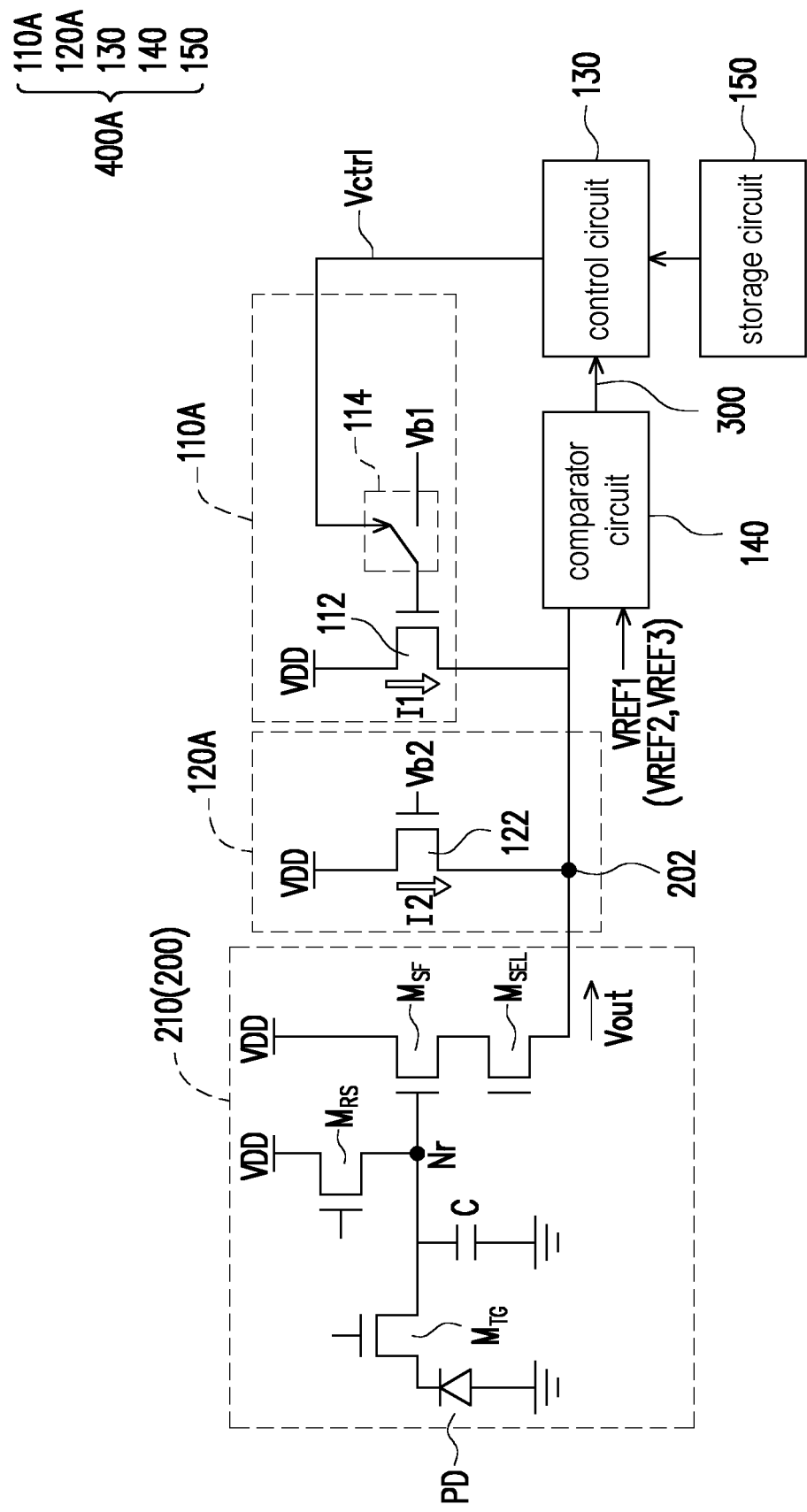
FIG. 5 is a schematic diagram illustrating a sensor circuit and a readout integrated circuit according to an embodiment of the invention.

The first charging/discharging circuit 110 is coupled to the output terminal 202. The first charging/discharging circuit 110 is configured to be controlled by the control circuit 130 via a control signal Vctrl to charge or discharge the output terminal 202 by a first current I1 as illustrated in FIG. 5. The second charging/discharging circuit 120 is coupled to the output terminal 202. The second charging/discharging circuit 120 is configured to charge or discharge the output terminal 202 by a second current I2 as illustrated in FIG. 5. In an embodiment, the second charging/discharging circuit 120 may be also controlled by the control circuit 130.

FIG. 5 is a schematic diagram illustrating a sensor circuit and a readout integrated circuit according to an embodiment of the invention. Referring to FIG. 5, the readout integrated circuit 400A includes a first charging/discharging circuit 110A, a second charging/discharging circuit 120A, the control circuit 130, the comparator circuit 140 and a storage circuit 150. Circuit structures of the sensor circuit 210, the first charging/discharging circuit 110A and the second charging/discharging circuit 120A are further illustrated in FIG. 5. However, the circuit structures thereof do not intend to limit the invention.

An active pixel structure of four transistors is taken as an example for the sensor circuit 210. In a reset period, a reset transistor $M_{RS}$ is conducted, and a voltage at a node Nr is pulled up to a high voltage VDD to turn off the source follower formed by the transistor $M_{SF}$. At the reset period, an output voltage Vout of the output terminal 202 is discharged. In an exposure period, a photo-sensing mechanism is performed, and a photodiode PD is leaking. In a readout period, a select transistor $M_{SEL}$ is conducted, and then the reset transistor $M_{RS}$ is conducted again. Next, a transfer transistor $M_{TG}$ is conducted, and a sensing voltage with respect to fingerprint information is transmitted to the node Nr. Therefore, the voltage at the node Nr changes from the high voltage VDD to the sensing voltage, which is lower than the high voltage VDD. In the readout period, the output voltage Vout at the steady state is determined by the voltage at the node Nr. For example, when the voltage at the node Nr in the readout period is a voltage 2V, the output voltage Vout at the steady state is approximate to a voltage 2V−Vgs, where Vgs is a voltage difference between a gate terminal and a source terminal of the source follower formed by a transistor $M_{SF}$. Therefore, the output voltage Vout is read out in the readout period, and serves as a sensing signal.

The first charging/discharging circuit 110A operates as a charging circuit. The first charging/discharging circuit 110A includes a first current source 112 and a switch element 114. The first current source 112 is controlled by a first voltage Vb1 to generate the first current I1. The first current source 112 includes a first terminal, a second terminal and a control terminal. The first current I1 is transmitted from the first terminal to the second terminal. The first terminal of the first current source 112 is coupled to the high voltage VDD. The second terminal of the first current source 112 is coupled to the output terminal 202 and the comparator circuit 140. The control terminal of the first current source 112 is coupled to the first voltage Vb1. The switch element 114 is controlled by the control signal Vctrl. The switch element 114 includes a first terminal, a second terminal and a control terminal. The first terminal of the switch element 114 is coupled to the first voltage Vb1. The second terminal of the switch element 114 is coupled to the control terminal of the first current source 112. The control terminal of the switch element 114 is coupled to the control signal Vctrl.

To be specific, the switch element 114 is coupled to the control circuit 130. The switch element 114 is turned on or off by the control signal Vctrl from the control circuit 130. The control signal Vctrl is generated by the control circuit 130 according to the determined supplementary charge amount. The switch element 114 is coupled to the control terminal of the first current source I1, such that a turn-on period of the switch element 114 determines a period of the first current source 112 outputting the first current I1. The supplementary charge amount is determined based on the first current I1 and the period of the first current source 112 outputting the first current I1. For example, when the first current source 112 is turned on, the supplementary charge amount is determined based on the value of the first current I1. The larger the value of the first current I1 is, the larger the supplementary charge amount is. In addition, the longer the period of the first current source 112 outputting the first current I1 is, the larger the supplementary charge amount is.

The second charging/discharging circuit 120A also operates as a charging circuit. The second charging/discharging circuit 120A is coupled to the output terminal 202 of the sensor array 200. The second charging/discharging circuit 120A is configured to charge the output terminal 202 by a second current I2 during the readout period. The second charging/discharging circuit 120A includes a second current source 122. The second current source 122 is controlled by a second voltage Vb2 to generate the second current I2. The second current source 122 includes a first terminal, a second terminal and a control terminal. The second current I2 is transmitted from the first terminal to the second terminal. The first terminal of the second current source 122 is coupled to the high voltage VDD. The second terminal of the second current source 122 is coupled to the output terminal 202. The control terminal of the second current source 122 is coupled to the second voltage Vb2.

In an embodiment, the first current I1 is larger than the second current I2, such that the charging operation is dominated by the first charging/discharging circuit 110A, but the invention is not limited thereto. In another embodiment, the first current I1 may be equal to or smaller than the second current I2.

The control circuit 130 is coupled to the first charging/discharging circuit 110A. The control circuit 130 receives the comparison result 300 and determines the supplementary charge amount to be charged to the output terminal 202 according to the comparison result 300, such that the voltage of the output terminal 202 can approach a corresponding target voltage. The target voltage (i.e. the sensing voltage Vs) follows the voltage at the node Nr. The control circuit 130 outputs the control signal Vctrl to control an operating period of the first charging/discharging circuit 110A. The operating period of the first charging/discharging circuit 110A indicates a period that the first charging/discharging circuit 110A charges the output terminal 202 of the sensor array 200.

Figure 6:
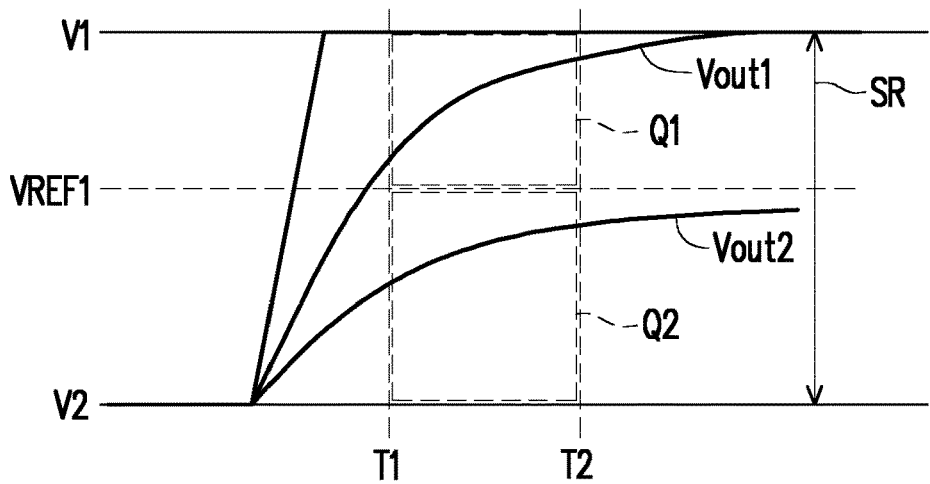
FIG. 6 is a waveform diagram of different output voltages at the output terminal during different operation periods according to an embodiment of the invention.

FIG. 6 is a waveform diagram of different output voltages at the output terminal during different operation periods according to an embodiment of the invention. In FIG. 6, a signal range SR is an input voltage range of the analog-to-digital converter. The input voltage range is a voltage range between a highest input voltage (a maximum reference voltage) V1 and a lowest input voltage (a minimum reference voltage) V2.

The comparator circuit 140 compares the output voltage Vout to the reference voltage VREF1 (a first reference voltage) at different time points T1 and T2 to generate a comparison result 300. According to the comparison result 300, the control circuit 130 determines the supplementary charge amount to be charged to the output terminal 202.

For example, when the comparison result 300 indicates the output voltage Vout1 is in a range from the first reference voltage VREF1 to the maximum reference voltage V1, the control circuit 130 determines a first charge amount Q1 as the supplementary charge amount to be charged to the output terminal 202 according to the comparison result 300. At the time point T1, when the comparison result 300 indicates the output voltage Vout2 is smaller than the first reference voltage VREF1, the control circuit 130 determines a charge amount Q2 smaller than the first charge amount Q1 as the supplementary charge amount to be charged to the output terminal 202 according to the comparison result 300. At another time point T2, the control circuit 130 performs similar operation and may determine a different supplementary charge amount from that is determined in response to the same comparison result at the time point T1. The control circuit 130 may perform similar operation at more time points, and the time length from one time point to a next time point may be determined by the control circuit 130.

In the present embodiment, the storage circuit 150 is coupled to the control circuit 130 and configured to store a look-up table. The control circuit 130 determines the supplementary charge amount according to the look-up table stored in the look-up table and the comparison result 300. The look-up table information of different charge amounts corresponding to a plurality of preconfigured comparison result. That is to say, the look-up table information includes a corresponding relationship between the supplementary charge amount and the comparison result. The storage circuit 150 may include a memory circuit and/or a register circuit to store the look-up table information, but the invention is not limited thereto.

Figure 7:
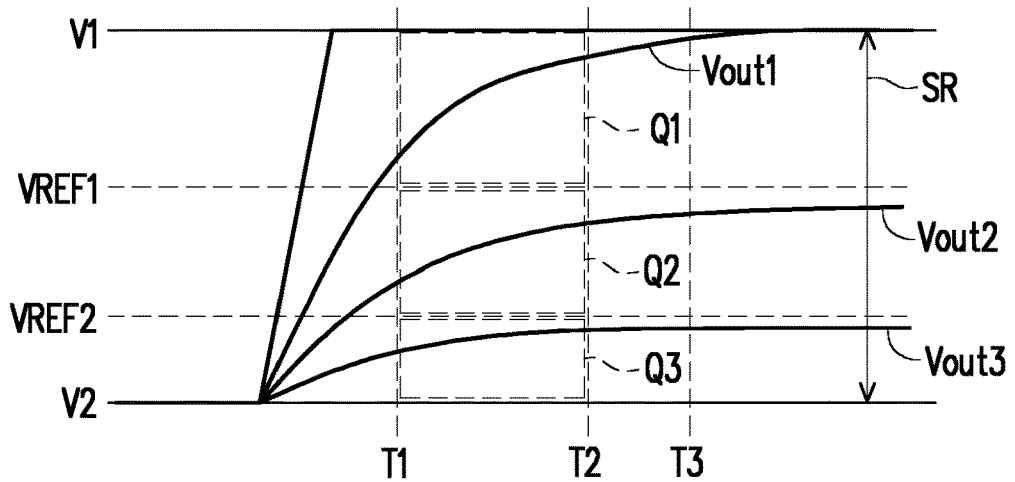
FIG. 7 is a waveform diagram of different output voltages at the output terminal during different operation periods according to another embodiment of the invention.

FIG. 7 is a waveform diagram of different output voltages at the output terminal during different operation periods according to another embodiment of the invention. Referring to FIG. 5 and FIG. 7, the comparator circuit 140 compares the output voltage Vout to the first reference voltage VREF1 and a second reference voltage VREF2 at different time points T1, T2 and T3 to generate at least one comparison result 300. The second reference voltage VREF2 is smaller than the first reference voltage VREF1. According to the respective comparison result 300, the control circuit 130 determines the supplementary charge amount to be charged to the output terminal 202.

For example, at the time point T1, T2 or T3, when the comparison result 300 indicates the output voltage Vout1 is in a range from the first reference voltage VREF1 to the maximum reference voltage V1, the control circuit 130 determines a first charge amount Q1 as the supplementary charge amount to be charged to the output terminal 202 according to the comparison result 300. At the time point T1, T2 or T3, when the comparison result 300 indicates the output voltage Vout2 is in a range from the second reference voltage VREF2 to the first reference voltage VREF1, the control circuit 130 determines a second charge amount Q2 as the supplementary charge amount to be charged to the output terminal 202 according to the comparison result 300. At the time point T1, T2 or T3, when the comparison result 300 indicates the output voltage Vout3 is smaller than the second reference voltage VREF2, the control circuit 130 determines a charge amount Q3 smaller than the second charge amount Q2 as the supplementary charge amount to be charged to the output terminal 202 according to the comparison result 300. It should be noted that, as an example, a supplementary charge amount determined based on a comparison result (e.g., output voltage Vout2 is in a range from the second reference voltage VREF2 to the first reference voltage VREF1) at the time point T2 is different than a supplementary charge amount determined based on the same comparison result (which is, output voltage Vout2 is in a range from the second reference voltage VREF2 to the first reference voltage VREF1) at the time point T1, since the time point T2 is more close to the time that Vout settles to the target voltage.

Figure 8:
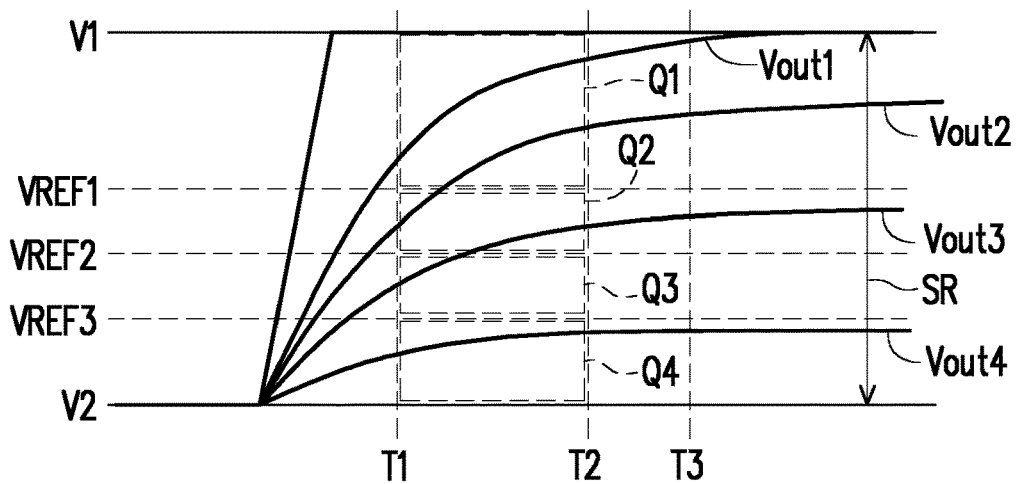
FIG. 8 is a waveform diagram of different output voltages at the output terminal during different operation periods according to another embodiment of the invention.

FIG. 8 is a waveform diagram of different output voltages at the output terminal during different operation periods according to another embodiment of the invention. Referring to FIG. 5 and FIG. 8, the comparator circuit 140 compares the output voltage Vout to the first reference voltage VREF1, the second reference voltage VREF2 and a third reference voltage VREF3 at different time points T1, T2 and T3 to generate at least one comparison result 300. The third reference voltage VREF3 is smaller than the second reference voltage VREF2. According to the respective comparison result 300, the control circuit 130 determines the supplementary charge amount to be charged to the output terminal 202.

For example, at the time point T1, when the comparison result 300 indicates the output voltage Vout3 is in a range from the third reference voltage VREF3 to the second reference voltage VREF2, the control circuit 130 determines a third charge amount Q3 as the supplementary charge amount to be charged to the output terminal 202 according to the comparison result 300. At the time point T1, T2 or T3, when the comparison result 300 indicates the output voltage Vout4 is smaller than the third reference voltage VREF3, the control circuit 130 determines a charge amount Q4 smaller than the third charge amount Q3 as the supplementary charge amount to be charged to the output terminal 202 according to the comparison result 300.

Figure 9:
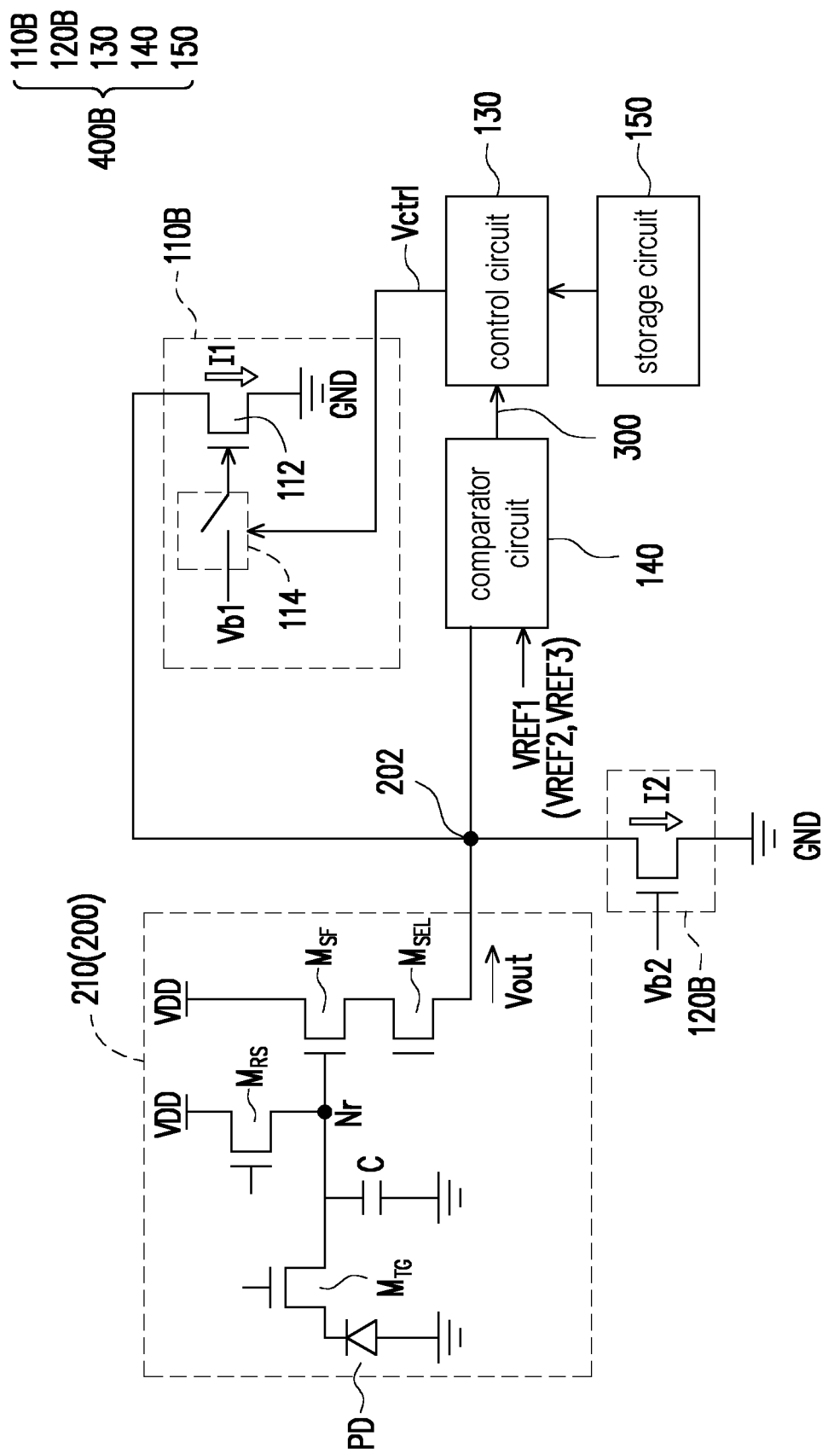
FIG. 9 is a schematic diagram illustrating a sensor circuit and a readout integrated circuit according to an embodiment of the invention.

FIG. 9 is a schematic diagram illustrating a sensor circuit and a readout integrated circuit according to an embodiment of the invention. Referring to FIG. 9, the readout integrated circuit 400B includes a first charging/discharging circuit 110B, a second charging/discharging circuit 120B, the control circuit 130, the comparator circuit 140 and a storage circuit 150. Circuit structures of the first charging/discharging circuit 110B and the second charging/discharging circuit 120B are further illustrated in FIG. 9. However, the circuit structures thereof do not intend to limit the invention.

The first charging/discharging circuit 110B operates as a discharging circuit. The first charging/discharging circuit 110B includes a first current source 112 and a switch element 114. The first current source 112 is controlled by a first voltage Vb1 to generate the first current I1. The first current source 112 includes a first terminal, a second terminal and a control terminal. The first current I1 is transmitted from the first terminal to the second terminal. The first terminal of the first current source 112 is coupled to the output terminal 202 and the comparator circuit 140. The second terminal of the first current source 112 is coupled to a ground voltage GND. The control terminal of the first current source 112 is coupled to the first voltage Vb1. The switch element 114 is controlled by the control signal Vctrl. The switch element 114 includes a first terminal, a second terminal and a control terminal. The first terminal of the switch element 114 is coupled to the first voltage Vb1. The second terminal of the switch element 114 is coupled to the control terminal of the first current source 112. The control terminal of the switch element 114 is coupled to the control signal Vctrl.

To be specific, the switch element 114 is coupled to the control circuit 130. The switch element 114 is turned on or off by the control signal Vctrl from the control circuit 130. The control signal Vctrl is generated by the control circuit 130 according to the determined supplementary charge amount. The switch element 114 is coupled to the control terminal of the first current source I1, such that a turn-on period of the switch element 114 determines a period of the first current source 112 outputting the first current I1. The supplementary charge amount is determined based on the first current I1 and the period of the first current source 112 outputting the first current I1. For example, when the first current source 112 is turned on, the supplementary charge amount is determined based on the value of the first current I1. The larger the value of the first current I1 is, the larger the supplementary charge amount is. In addition, the longer the period of the first current source 112 outputting the first current I1 is, the larger the supplementary charge amount is.

The control circuit 130 is coupled to the first charging/discharging circuit 110B. The control circuit 130 outputs the control signal Vctrl to control an operating period of the first charging/discharging circuit 110B. The operating period of the first charging/discharging circuit 110B indicates a period that the first charging/discharging circuit 110B discharges the output terminal 202 of the sensor array 200.

The second charging/discharging circuit 120B also operates as a discharging circuit. The second charging/discharging circuit 120B is coupled to the output terminal 202 of the sensor array 200. The second charging/discharging circuit 120B is configured to discharge the output terminal 202 by a second current I2 during the readout period. The second charging/discharging circuit 120B includes a second current source 122. The second current source 122 is controlled by a second voltage Vb2 to generate the second current I2. The second current source 122 includes a first terminal, a second terminal and a control terminal. The second current I2 is transmitted from the first terminal to the second terminal. The first terminal of the second current source 122 is coupled to the output terminal 202. The second terminal of the second current source 122 is coupled to the ground voltage. The control terminal of the second current source 122 is coupled to the second voltage Vb2.

In an embodiment, the first current I1 is larger than the second current I2, such that the discharging operation is dominated by the first charging/discharging circuit 110B, but the invention is not limited thereto. In another embodiment, the first current I1 may be equal to the second current I2.

Figure 10:
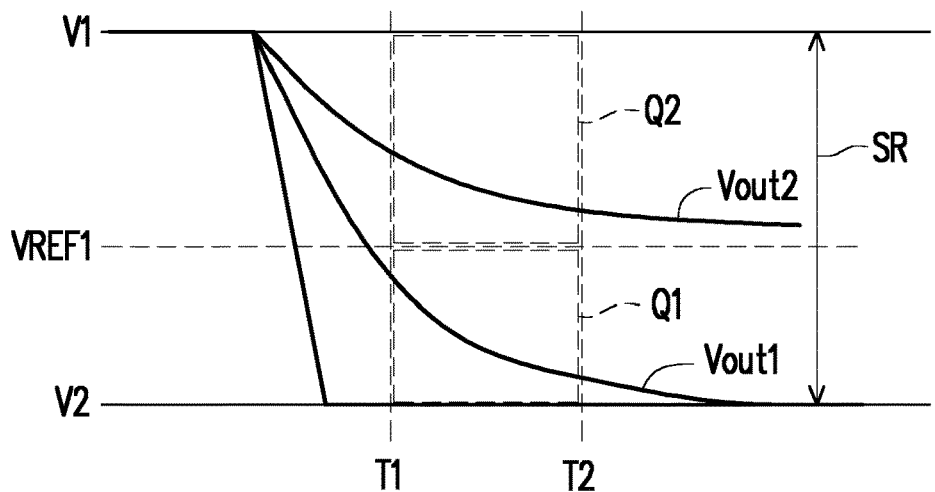
FIG. 10 is a waveform diagram of different output voltages at the output terminal during different operation periods according to an embodiment of the invention.

FIG. 10 is a waveform diagram of different output voltages at the output terminal during different operation periods according to an embodiment of the invention. Referring to FIG. 9 and FIG. 10, the comparator circuit 140 compares the output voltage Vout to the reference voltage VREF1 (the first reference voltage) at different time points T1 and T2 to generate a comparison result 300. According to the comparison result 300, the control circuit 130 determines the supplementary charge amount to be discharged from the output terminal 202.

For example, at the time point T1 or T2, when the comparison result 300 indicates the output voltage Vout1 is in a range from the first reference voltage VREF1 to the minimum reference voltage V2, the control circuit 130 determines a first charge amount Q1 as the supplementary charge amount to be discharged from the output terminal 202 according to the comparison result 300. At the time point T1 or T2, when the comparison result 300 indicates the output voltage Vout2 is larger than the first reference voltage VREF1, the control circuit 130 determines a charge amount Q2 smaller than the first charge amount Q1 as the supplementary charge amount to be discharged from the output terminal 202 according to the comparison result 300.

Figure 11:
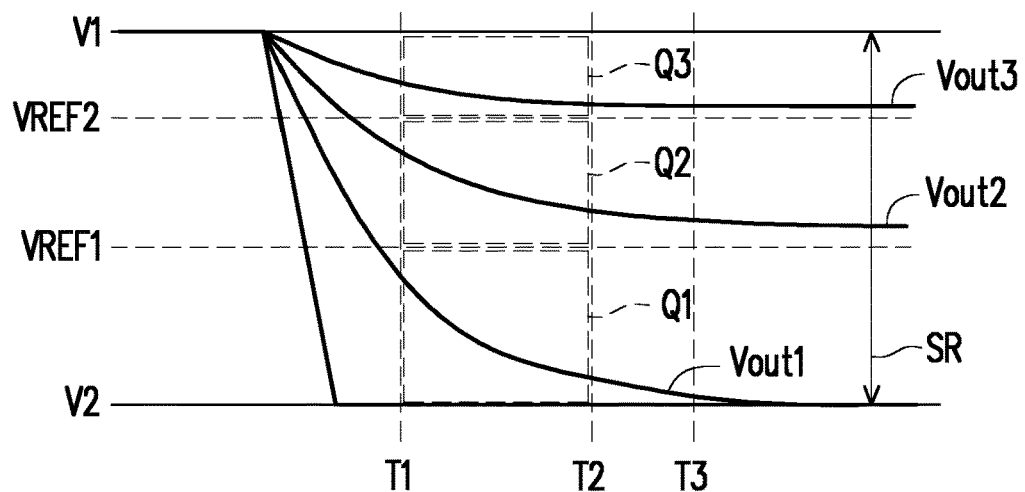
FIG. 11 is a waveform diagram of different output voltages at the output terminal during different operation periods according to another embodiment of the invention.

FIG. 11 is a waveform diagram of different output voltages at the output terminal during different operation periods according to another embodiment of the invention. Referring to FIG. 9 and FIG. 11, the comparator circuit 140 compares the output voltage Vout to the first reference voltage VREF1 and the second reference voltage VREF2 at different time points T1, T2 and T3 to generate at least one comparison result 300. The second reference voltage VREF2 is larger than the first reference voltage VREF1. According to the respective comparison result 300, the control circuit 130 determines the supplementary charge amount to be discharged from the output terminal 202.

For example, at the time point T1, T2 or T3, when the comparison result 300 indicates the output voltage Vout1 is in a range from the first reference voltage VREF1 to the minimum reference voltage V2, the control circuit 130 determines a first charge amount Q1 as the supplementary charge amount to be discharged from the output terminal 202 according to the comparison result 300. At the time point T1, T2 or T3, when the comparison result 300 indicates the output voltage Vout2 is in a range from the second reference voltage VREF2 to the first reference voltage VREF1, the control circuit 130 determines a second charge amount Q2 as the supplementary charge amount to be discharged from the output terminal 202 according to the comparison result 300. At the time point T1, T2 or T3, when the comparison result 300 indicates the output voltage Vout3 is larger than the second reference voltage VREF2, the control circuit 130 determines a charge amount Q3 smaller than the second charge amount Q2 as the supplementary charge amount to be discharged from the output terminal 202 according to the comparison result 300.

Figure 12:
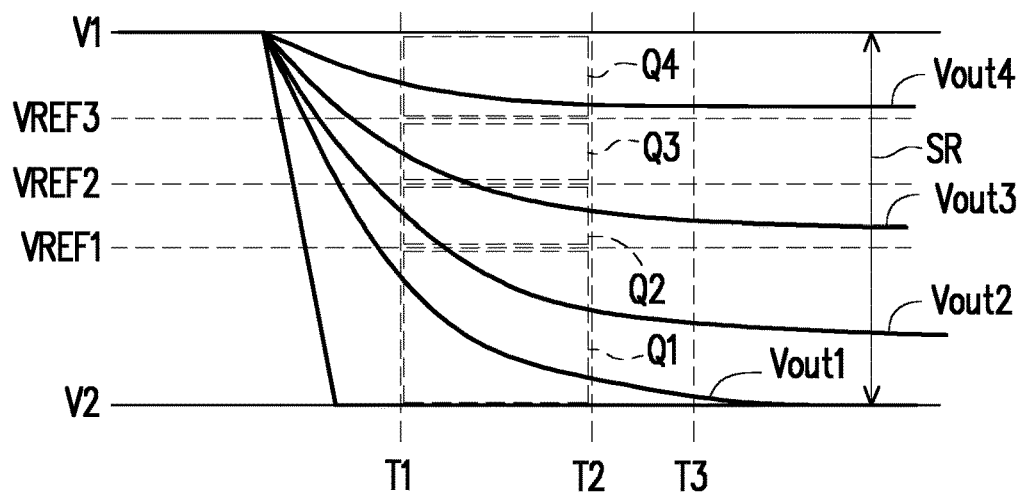
FIG. 12 is a waveform diagram of different output voltages at the output terminal during different operation periods according to another embodiment of the invention.

FIG. 12 is a waveform diagram of different output voltages at the output terminal during different operation periods according to another embodiment of the invention. Referring to FIG. 9 and FIG. 12, the comparator circuit 140 compares the output voltage Vout to the first reference voltage VREF1, the second reference voltage VREF2 and the third reference voltage VREF3 at different time points T1, T2 and T3 to generate at least one comparison result 300. The third reference voltage VREF3 is larger than the second reference voltage VREF2. According to the respective comparison result 300, the control circuit 130 determines the supplementary charge amount to be discharged from the output terminal 202.

For example, at the time point T1, when the comparison result 300 indicates the output voltage Vout3 is in a range from the third reference voltage VREF3 to the second reference voltage VREF2, the control circuit 130 determines a third charge amount Q3 as the supplementary charge amount to be discharged from the output terminal 202 according to the comparison result 300. At the time point T1, T2 or T3, when the comparison result 300 indicates the output voltage Vout4 is larger than the third reference voltage VREF3, the control circuit 130 determines a charge amount Q4 smaller than the third charge amount Q3 as the supplementary charge amount to be discharged from the output terminal 202 according to the comparison result 300.

Figure 13:
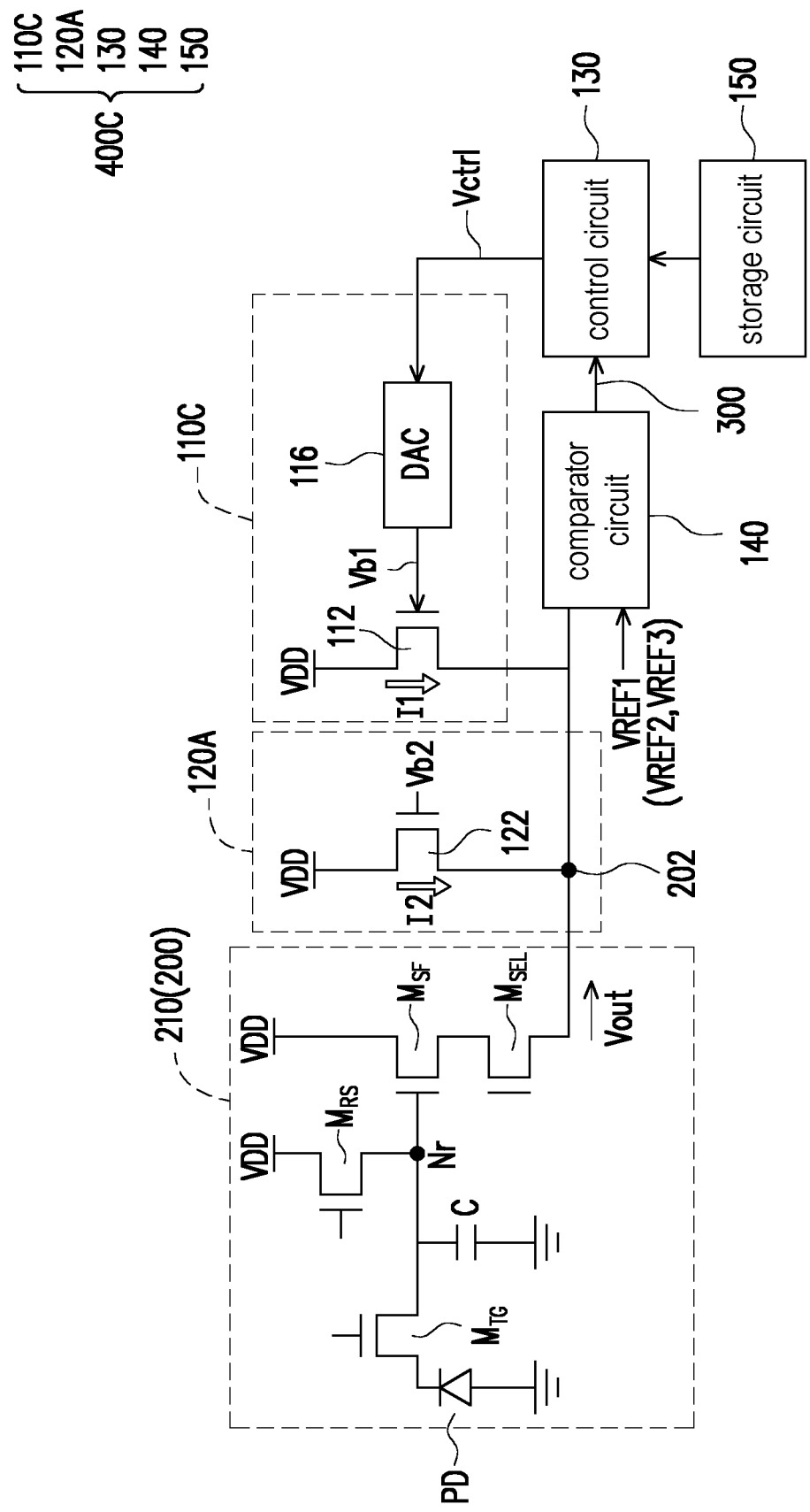
FIG. 13 is a schematic diagram illustrating a sensor circuit and a readout integrated circuit according to another embodiment of the invention.

FIG. 13 is a schematic diagram illustrating a sensor circuit and a readout integrated circuit according to another embodiment of the invention. Referring to FIG. 5 and FIG. 13, the readout integrated circuit 400C of the present embodiment is similar to the readout integrated circuit 400A of FIG. 5, and the main difference therebetween, for example, lies in the circuit structure of the first charging/discharging circuit 110C.

To be specific, the first charging/discharging circuit 110C operates as a charging circuit. The first charging/discharging circuit 110C includes the first current source 112 and a conversion circuit 116. The conversion circuit 116 may be a digital-to-analog converter (DAC). The first current source 112 is controlled by the first voltage Vb1 to generate the first current I1. The conversion circuit 116 is coupled to the control terminal of the first current source 112 and the control circuit 130. The conversion circuit 116 is configured to generate a control voltage Vb1. The control voltage Vb1 is outputted to the control terminal of the first current source 112 according to the control signal Vctrl from the control circuit 130. The amount of the first current I1 is determined according to the control voltage Vb1. Since the control voltage Vb1 is outputted according to the control signal Vctrl from the control circuit 130, a period of the first current source 112 outputting the first current I1 is also determined by the control signal Vctrl from the control circuit 130.

In the present embodiment, the control circuit 130 outputs the digital control signal Vctrl according to the look-up table stored in the storage circuit 150 and the comparison result 300. The conversion circuit 116 converts the digital control signal Vctrl to the analog control voltage Vb1 and outputs the analog control voltage Vb1 to the first current source 112. The analog control voltage Vb1 can adjust the amount of the first current I1, and thus the amount of the first current I1 is determined according to the control voltage Vb1. Therefore, the supplementary charge amount to be charged to the output terminal 202 is also determined according to the control voltage Vb1.

The operation of the readout integrated circuit 400C described in the embodiment of the invention is sufficiently taught, suggested, and embodied in the embodiments illustrated in FIG. 5, and therefore no further description is provided herein.

Figure 14:
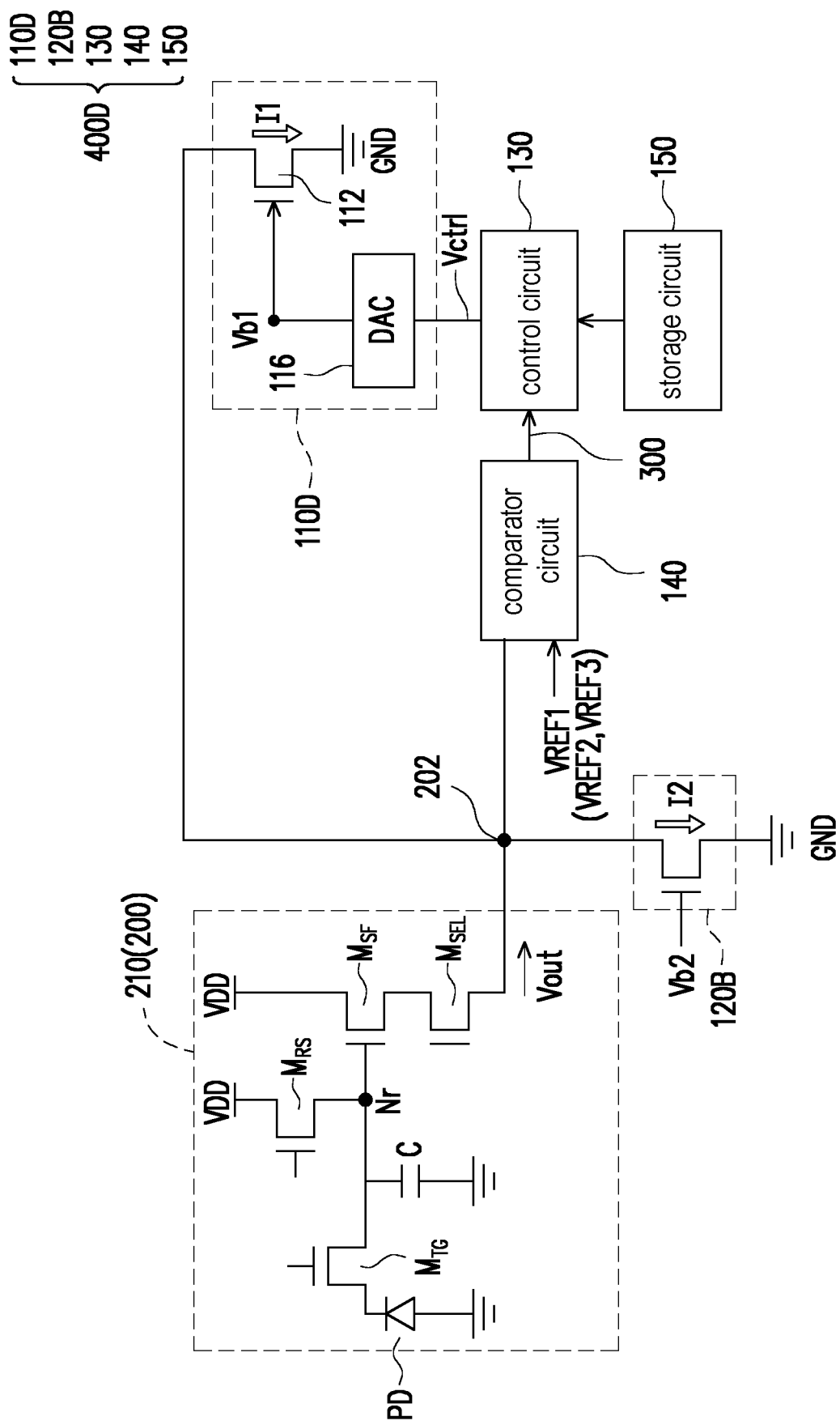
FIG. 14 is a schematic diagram illustrating a sensor circuit and a readout integrated circuit according to another embodiment of the invention.

FIG. 14 is a schematic diagram illustrating a sensor circuit and a readout integrated circuit according to another embodiment of the invention. Referring to FIG. 9 and FIG. 14, the readout integrated circuit 400D of the present embodiment is similar to the readout integrated circuit 400B of FIG. 9, and the main difference therebetween, for example, lies in the circuit structure of the first charging/discharging circuit 110D.

To be specific, the first charging/discharging circuit 110D operates as a discharging circuit. The first charging/discharging circuit 110D includes the first current source 112 and the conversion circuit 116. The first current source 112 is controlled by the first voltage Vb1 to generate the first current I1. The conversion circuit 116 is coupled to the control terminal of the first current source 112 and the control circuit 130. The conversion circuit 116 is configured to generate the control voltage Vb1. The control voltage Vb1 is outputted to the control terminal of the first current source 112 according to the control signal Vctrl from the control circuit 130. The amount of the first current I1 is determined according to the control voltage Vb1.

In the present embodiment, the control circuit 130 outputs the digital control signal Vctrl according to the look-up table stored in the storage circuit 150 and the comparison result 300. The conversion circuit 116 converts the digital control signal Vctrl to the analog control voltage Vb1 and outputs the analog control voltage Vb1 to the first current source 112. The analog control voltage Vb1 can adjust the amount of the first current I1, and thus the amount of the first current I1 is determined according to the control voltage Vb1. Therefore, the supplementary charge amount to be discharged from the output terminal 202 is also determined according to the control voltage Vb1.

The operation of the readout integrated circuit 400D described in the embodiment of the invention is sufficiently taught, suggested, and embodied in the embodiments illustrated in FIG. 9, and therefore no further description is provided herein.

Figure 15:
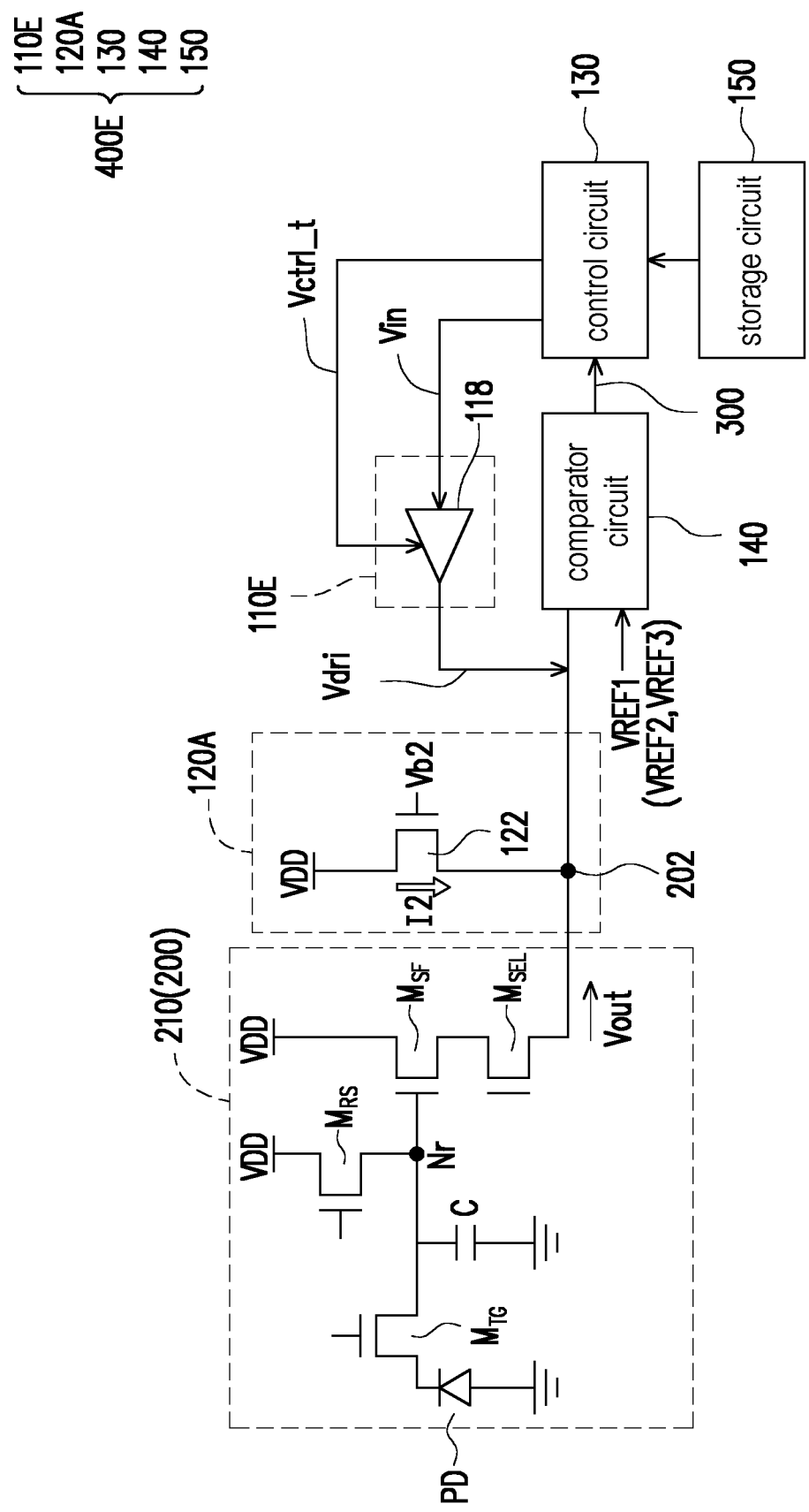
FIG. 15 is a schematic diagram illustrating a sensor circuit and a readout integrated circuit according to another embodiment of the invention.

FIG. 15 is a schematic diagram illustrating a sensor circuit and a readout integrated circuit according to another embodiment of the invention. Referring to FIG. 5 and FIG. 15, the readout integrated circuit 400E of the present embodiment is similar to the readout integrated circuit 400A of FIG. 5, and the main difference therebetween, for example, lies in the circuit structure of the first charging/discharging circuit 110E.

To be specific, the first charging/discharging circuit 110E operates as a charging circuit. The first charging/discharging circuit 110E includes a buffer circuit 118. The buffer circuit 118 may be a buffer or a source follower. The control circuit 130 outputs an input voltage Vin and a timing control signal Vctrl_t. The buffer circuit 118 is configured to receive the input voltage Vin from the control circuit 130 and the timing control signal Vctrl_t from the control circuit 130 and output a driving voltage Vdri to charge the output terminal 202. For example, the driving voltage Vdri may be a positive voltage to directly pull up the voltage of the output terminal 202. A period of the buffer circuit 118 outputting the driving voltage Vdri is controlled by the timing control signal Vctrl_t.

The operation of the readout integrated circuit 400E described in the embodiment of the invention is sufficiently taught, suggested, and embodied in the embodiments illustrated in FIG. 5, and therefore no further description is provided herein.

Figure 16:
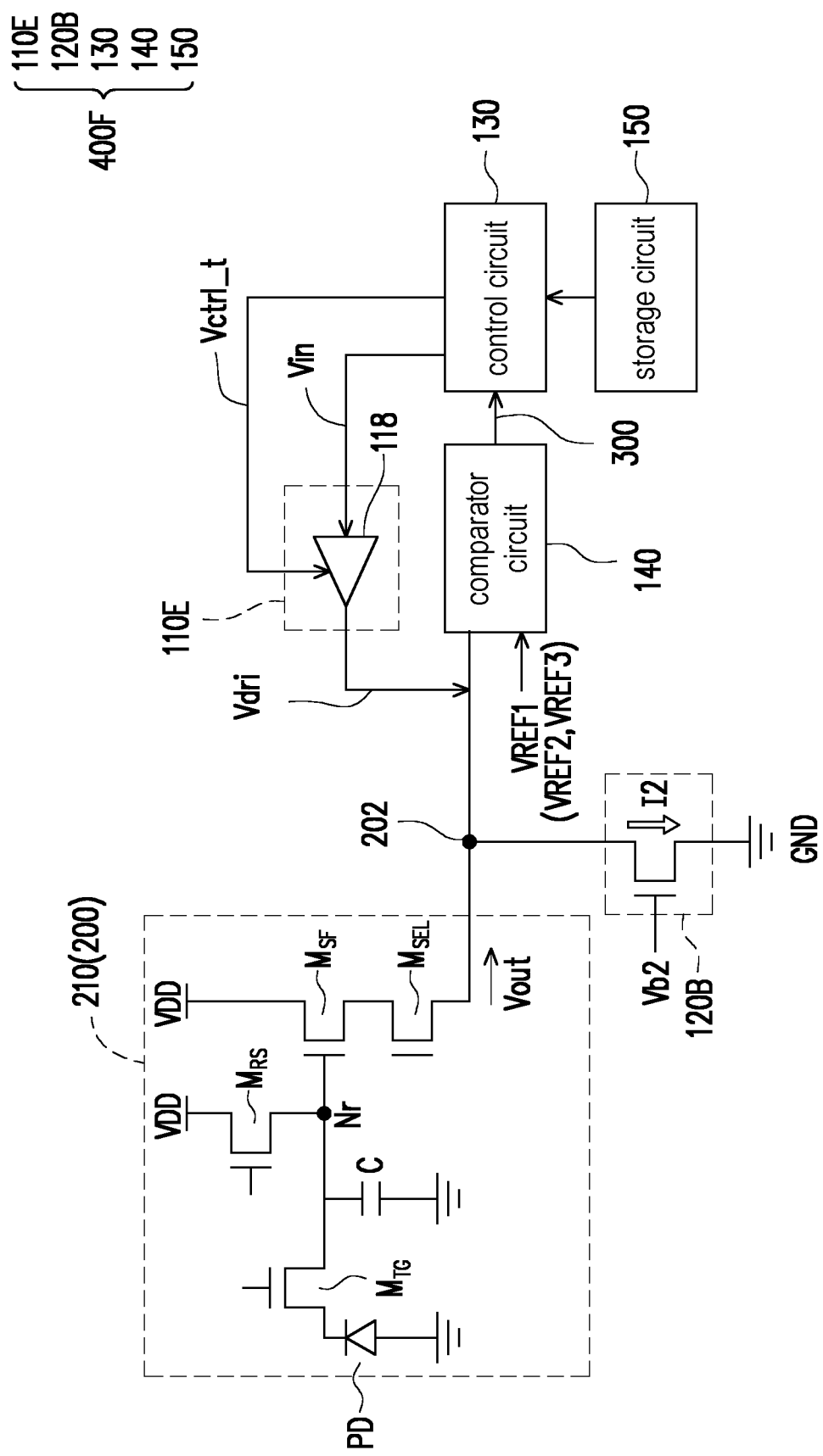
FIG. 16 is a schematic diagram illustrating a sensor circuit and a readout integrated circuit according to another embodiment of the invention.

FIG. 16 is a schematic diagram illustrating a sensor circuit and a readout integrated circuit according to another embodiment of the invention. Referring to FIG. 9 and FIG. 16, the readout integrated circuit 400F of the present embodiment is similar to the readout integrated circuit 400B of FIG. 9, and the main difference therebetween, for example, lies in the circuit structure of the first charging/discharging circuit 110E.

To be specific, the first charging/discharging circuit 110E operates as a discharging circuit. The first charging/discharging circuit 110E includes a buffer circuit 118. The buffer circuit 118 may be a buffer or a source follower. The control circuit 130 outputs an input voltage Vin and a timing control signal Vctrl_t. The buffer circuit 118 is configured to receive the input voltage Vin from the control circuit 130 and the timing control signal Vctrl_t from the control circuit 130 and output a driving voltage Vdri to discharge the output terminal 202. For example, the driving voltage Vdri may be a negative voltage to directly pull down the voltage of the output terminal 202. A period of the buffer circuit 118 outputting the driving voltage Vdri is controlled by the timing control signal Vctrl_t.

The operation of the readout integrated circuit 400F described in the embodiment of the invention is sufficiently taught, suggested, and embodied in the embodiments illustrated in FIG. 5, and therefore no further description is provided herein.

In summary, in the embodiments of the invention, the supplementary charge amount to be charged to or discharged from the output terminal is determined according to the comparison result of the output voltage and the reference voltage. Therefore, a charging to or discharging speed of the fingerprint sensing signals can become faster, and the settling time of the fingerprint sensing signals is short to improve the quality of the fingerprint image.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A readout integrated circuit, configured to read out sensing signals from an optical sensing panel comprising a sensor array for fingerprint sensing, the readout integrated circuit comprising:
   a plurality of input terminals, configured to be coupled to a plurality of output terminals of the optical sensing panel;
   a comparator circuit, coupled to an input terminal of the plurality of input terminals and configured to receive an output voltage from an output terminal of the plurality of output terminals of the optical sensing panel and at least one reference voltage, compare the output voltage to the at least one reference voltage and output a comparison result;
   a control circuit, coupled to the comparator circuit and configured to receive the comparison result and determine a supplementary charge amount to be charged to or discharged from the output terminal according to the comparison result; and
   a first charging/discharging circuit, coupled to the output terminal of the optical sensing panel and configured to be controlled by the control circuit to charge or discharge the output terminal by a first current or by a driving voltage, wherein the supplementary charge amount is achieved by at least one of adjusting the amount of the first current and controlling a period of providing the first current.

2. The readout integrated circuit of claim 1, wherein the comparator circuit compares the output voltage to the at least one reference voltage at different time points to generate at least one comparison result, and according to the respective comparison result, the control circuit determines the supplementary charge amount to be charged to or discharged from the output terminal.

3. The readout integrated circuit of claim 2, wherein the at least one reference voltage comprises a first reference voltage, and
   when the comparison result indicates the output voltage is in a range from the first reference voltage to a maximum reference voltage, the control circuit determines a first charge amount as the supplementary charge amount to be charged to the output terminal according to the comparison result; and
   when the comparison result indicates the output voltage is smaller than the first reference voltage, the control circuit determines a charge amount smaller than the first charge amount as the supplementary charge amount to be charged to the output terminal according to the comparison result.

4. The readout integrated circuit of claim 3, wherein the at least one reference voltage further comprises a second reference voltage smaller than the first reference voltage, and
   when the comparison result indicates the output voltage is in a range from the second reference voltage to the first reference voltage, the control circuit determines a second charge amount as the supplementary charge amount to be charged to the output terminal according to the comparison result; and
   when the comparison result indicates the output voltage is smaller than the second reference voltage, the control circuit determines a charge amount smaller than the second charge amount as the supplementary charge amount to be charged to the output terminal according to the comparison result.

5. The readout integrated circuit of claim 4, wherein the at least one reference voltage further comprises a third reference voltage smaller than the second reference voltage, and
   when the comparison result indicates the output voltage is in a range from the third reference voltage to the second reference voltage, the control circuit determines a third charge amount as the supplementary charge amount to be charged to the output terminal according to the comparison result; and
   when the comparison result indicates the output voltage is smaller than the third reference voltage, the control circuit determines a charge amount smaller than the third charge amount as the supplementary charge amount to be charged to the output terminal according to the comparison result.

6. The readout integrated circuit of claim 2, wherein the at least one reference voltage comprises a first reference voltage, and
   when the comparison result indicates the output voltage is in a range from the first reference voltage to a minimum reference voltage, the control circuit determines a first charge amount as the supplementary charge amount to be discharged from the output terminal according to the comparison result; and when the comparison result indicates the output voltage is larger than the first reference voltage, the control circuit determines a charge amount smaller than the first charge amount as the supplementary charge amount to be discharged from the output terminal according to the comparison result.

7. The readout integrated circuit of claim 6, wherein the at least one reference voltage further comprises a second reference voltage larger than the first reference voltage, and when the comparison result indicates the output voltage is in a range from the second reference voltage to the first reference voltage, the control circuit determines a second charge amount as the supplementary charge amount to be discharged from the output terminal according to the comparison result; and when the comparison result indicates the output voltage is larger than the second reference voltage, the control circuit determines a charge amount smaller than the second charge amount as the supplementary charge amount to be discharged from the output terminal according to the comparison result.

8. The readout integrated circuit of claim 7, wherein the at least one reference voltage further comprises a third reference voltage larger than the second reference voltage, and when the comparison result indicates the output voltage is in a range from the third reference voltage to the second reference voltage, the control circuit determines a third charge amount as the supplementary charge amount to be discharged from the output terminal according to the comparison result; and when the comparison result indicates the output voltage is larger than the third reference voltage, the control circuit determines a charge amount smaller than the third charge amount as the supplementary charge amount to be discharged from the output terminal according to the comparison result.

9. The readout integrated circuit of claim 1, wherein the first charging/discharging circuit comprises a first current source controlled by a first voltage to generate the first current.

10. The readout integrated circuit of claim 9, wherein the first charging/discharging circuit further comprises:

a switch element, coupled to a control terminal of the first current source such that a turn-on period of the switch element determines a period of the first current source outputting the first current, wherein the supplementary charge amount is determined based on the first current and the period of the first current source outputting the first current.

11. The readout integrated circuit of claim 10, wherein the switch element is coupled to the control circuit and is turned on or off by a control signal from the control circuit, and wherein the control signal is generated by the control circuit according to the determined supplementary charge amount.

12. The readout integrated circuit of claim 9, wherein the first charging/discharging circuit further comprises:

a conversion circuit, coupled to a control terminal of the first current source and the control circuit, and configured to generate a control voltage to be outputted to the control terminal of the first current source according to a control signal from the control circuit, wherein the amount of the first current is determined according to the control voltage.

13. The readout integrated circuit of claim 12, wherein a period of the first current source outputting the first current is determined by the control signal from the control circuit.

14. The readout integrated circuit of claim 1, wherein the first charging/discharging circuit comprises a buffer circuit configured to receive an input voltage from the control circuit and a timing control signal from the control circuit to output the driving voltage to charge or discharge the output terminal, and wherein a period of the buffer circuit outputting the driving voltage is controlled by the timing control signal.

15. The readout integrated circuit of claim 1, further comprising:

a second charging/discharging circuit, coupled to the output terminal and configured to charge or discharge the output terminal by a second current.

16. The readout integrated circuit of claim 1, wherein the output terminal is coupled to a second charging/discharging circuit, and the second charging/discharging circuit is disposed in a display panel that the sensor array is disposed, and wherein the second charging/discharging circuit is configured to charge or discharge the output terminal by a second current.

17. The readout integrated circuit of claim 1, further comprising:

a storage circuit, coupled to the control circuit and configured to store a look-up table, wherein look-up table information of different charge amounts corresponding to a plurality of preconfigured comparison result.

18. A readout integrated circuit, configured to read out sensing signals from an optical sensing panel comprising a sensor array for fingerprint sensing, the readout integrated circuit comprising:

a plurality of input terminals, configured to be coupled to a plurality of output terminals of the optical sensing panel, wherein an input terminal of the plurality of input terminals receive an output voltage from an output terminal of the plurality of output terminals of the optical sensing panel; and a first charging/discharging circuit, coupled to the output terminal of the optical sensing panel and configured to charge or discharge the output terminal by a first current or by a driving voltage, wherein at least one of the amount of the first current and a period of providing the first current is associated with the output voltage from the output tell Anal of the optical sensing panel.

19. The readout integrated circuit of claim 18, further comprising:

a comparator circuit, coupled to the input terminal of the plurality of input terminals and configured to receive the output voltage and at least one reference voltage, compare the output voltage to the at least one reference voltage and output a comparison result; and a control circuit, coupled to the comparator circuit and configured to receive the comparison result and determine a supplementary charge amount to be charged to or discharged from the output terminal according to the comparison result, wherein the supplementary charge amount is achieved by at least one of adjusting the amount of the first current and controlling the period of providing the first current.

* * * * *